(12) United States Patent
Westra et al.

(10) Patent No.: US 7,482,891 B2
(45) Date of Patent: Jan. 27, 2009

(54) INTERPOLATING PROGRAMMABLE GAIN ATTENUATOR

(75) Inventors: Jan R. Westra, Uithoorn (NL); Jan Mulder, Houten (NL); Franciscus Maria Leonardus van der Goes, The Hague (NL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/822,652

(22) Filed: Jul. 9, 2007

(65) Prior Publication Data

US 2007/0257744 A1 Nov. 8, 2007

Related U.S. Application Data

(63) Continuation of application No. 10/830,112, filed on Apr. 23, 2004, now Pat. No. 7,242,267, which is a continuation-in-part of application No. 10/694,952, filed on Oct. 29, 2003, now Pat. No. 7,135,942.

(51) Int. Cl.
   *H03H 7/24* (2006.01)
(52) U.S. Cl. .................. 333/81 R; 330/284; 327/308
(58) Field of Classification Search ............ 330/278, 330/284, 144; 327/308; 333/81 R
   See application file for complete search history.

(56) References Cited

U.S. PATENT DOCUMENTS 6,175,278 B1   1/2001   Hasegawa

| | | | |
|---|---|---|---|
| 6,472,940 B1 * | 10/2002 | Behzad et al. | ............ 330/279 |
| 6,545,620 B2 | 4/2003 | Groeneweg | |
| 7,102,428 B2 | 7/2006 | Behzad | |
| 7,135,942 B2 | 11/2006 | Westra et al. | |
| 7,242,267 B2 | 7/2007 | Westra et al. | |

* cited by examiner

*Primary Examiner*—Stephen E Jones
(74) *Attorney, Agent, or Firm*—Sterne, Kessler, Goldstein & Fox P.L.L.C.

(57) ABSTRACT

A programmable gain attenuator includes a termination resistor. A first termination switch connects one side of the termination resistor to a first output. A second termination switch connects another side of the termination resistor to a second output. A first resistor ladder is arranged between a first input and the first side of the termination resistor. A first plurality of switches connect a corresponding tap from the first resistor ladder to the first output. A second resistor ladder is arranged between a second input and the second side of the termination resistor. A second plurality of switches connect a corresponding tap from the second resistor ladder to the second output. A first switch of the first plurality of switches is turned on, followed by a second switch of first plurality of switches turned off, followed by a third switch of first plurality of switches turned on. A first switch of the second plurality of switches is turned on, followed by a second switch of second plurality of switches turned off, followed by a third switch of second plurality of switches turned on.

14 Claims, 9 Drawing Sheets

US 7,482,891 B2

INTERPOLATING PROGRAMMABLE GAIN ATTENUATOR

CROSS-REFERENCE TO RELATED APPLICATION

This application is a continuation of application Ser. No. 10/830,112, filed Apr. 23, 2004 now U.S. Pat. No. 7,242,267, which is a continuation-in-part of U.S. patent application Ser. No. 10/694,952, filed Oct. 29, 2003 now U.S. Pat. No. 7,135,942, all of which are incorporated by reference herein in their entirety.

BACKGROUND OF THE INVENTION

1. Field of the Invention

The present invention relates to an interpolating programmable gain attenuator used in analog front ends.

2. Related Art

Broadband digital communication chips, such as cable modems and Ethernet chips, generally incorporate an analog front-end (AFE) on the chip, that comprises of an analog-to-digital converter (ADC) preceded by a programmable gain attenuator (PGA). The function of the PGA is to optimally use the dynamic range of the ADC.

FIG. 1 shows a conventional PGA. This circuit comprises a linear resistive attenuator (a resistive ladder), and is fully differential. The differential input voltage, denoted by vip and vin, is applied at the input of the PGA. Switches $M_1$, $M_2$, $M_3$, ... $M_n$, (here, NMOS transistors, although PMOS transistors, or CMOS transmission gates, i.e., both an NMOS and PMOS transistor in parallel, can also be used) connect to all of the 'taps' of the PGA. On each side of the PGA, all-but-one switches $M_1$, $M_2$, $M_3$, ... $M_n$ are 'off'. The one pair of switches that is 'on', determines the magnitude of the differential output voltage, denoted by vop and von.

The size of the switches $M_1$, $M_2$, $M_3$, ... $M_n$ is, in general, mainly determined by noise. To achieve low-noise performance, the on-resistance $r_{on}$ of the switches $M_1$, $M_2$, $M_3$, ... $M_n$ has to be low. As a consequence, switches with a large width have to be used. Unfortunately, large switches introduce substantial parasitic capacitances, decreasing the achievable bandwidth of the PGA. Furthermore, the chip area of the PGA can become quite large. Since the PGA is integrated on-chip, the chip area occupied by the PGA is an important factor, i.e., lower area means lower cost.

FIG. 2 shows an improved conventional PGA, where always M pairs of consecutive switches are turned 'on' simultaneously (in FIG. 2, M=4). As a result, the switches can be M times less wide compared to the circuit shown in FIG. 1, improving both the bandwidth and area of the PGA.

The PGA is used to attenuate an input voltage arranging from, e.g., 100 millivolts to 4 volts down to a set value of 100 millivolts, e.g. Thus, in the PGA shown in FIGS. 1 and 2, by turning on a successive switch, the output voltage is gradually increased. The input voltage to the gates of the switches are usually digitally controlled.

The parasitic capacitance of the switches is usually dominant compared to the parasitic capacitance of the resistors. Typical parasitic capacitance of the switches is about 10-20 femtofarads. A typical value of each resistor $R_1$ is several ohms. Typical dimensions for a resistor are about half a micron wide by a few microns long. The dimensions of the switches depend on process parameters, such as gate length (currently, about 0.09-0.35 microns). Typical value of the gate width is approximately 10-20 microns wide.

The PGA is used to attenuate the amplitude of the signal entering an amplifier or an A/D converter and often has as many as 500+ steps. Thus, using the structure illustrated in FIG. 1, for a 500 step PGA, 500×2 switches $M_1$, $M_2$, $M_3$, ... $M_{500}$ and 500×2 resistors $R_1$, need to be used. This requires a substantial area on the chip, e.g., 300×600 microns. Furthermore, because of the number of resistors and switches, they are usually not laid out in a straight line but are instead "folded" or laid out in zig zag pattern. The wiring trace length at the turning point of the zig zag pattern is longer than trace length elsewhere, introducing additional layout difficulties and potentially reducing the accuracy of the PGA. Also, the extra lengths of the trace at the zigzag can decrease the bandwidth of the PGA at that particular setting.

SUMMARY OF THE INVENTION

The present invention is directed to a programmable gain attenuator that substantially obviates one or more of the problems and disadvantages of the related art.

Accordingly, in one embodiment, there is provided a programmable gain attenuator including a termination resistor. A first termination switch connects one side of the termination resistor to a first output. A second termination switch connects another side of the termination resistor to a second output. A first resistor ladder is arranged between a first input and the first side of the termination resistor. A first plurality of switches connect a corresponding tap from the first resistor ladder to the first output. A second resistor ladder is arranged between a second input and the second side of the termination resistor. A second plurality of switches connect a corresponding tap from the second resistor ladder to the second output. The switches are arranged in a matrix, and may be selectively turned on and off. Optionally, the switches may be grouped in fine and coarse switch submatrices, and controlled using fine and coarse control logic, respectively, and a multiplexer.

Additional features and advantages of the invention will be set forth in the description that follows, and in part will be apparent from the description, or may be learned by practice of the invention. The advantages of the invention will be realized and attained by the structure particularly pointed out in the written description.

It is to be understood that both the foregoing general description and the following detailed description are exemplary and explanatory and are intended to provide further explanation of the invention.

BRIEF DESCRIPTION OF THE DRAWINGS/FIGURES

The accompanying drawings, which are included to provide a further understanding of the exemplary embodiments of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the embodiments of the present invention, examples of which are illustrated in the accompanying drawings.

Figure 2:
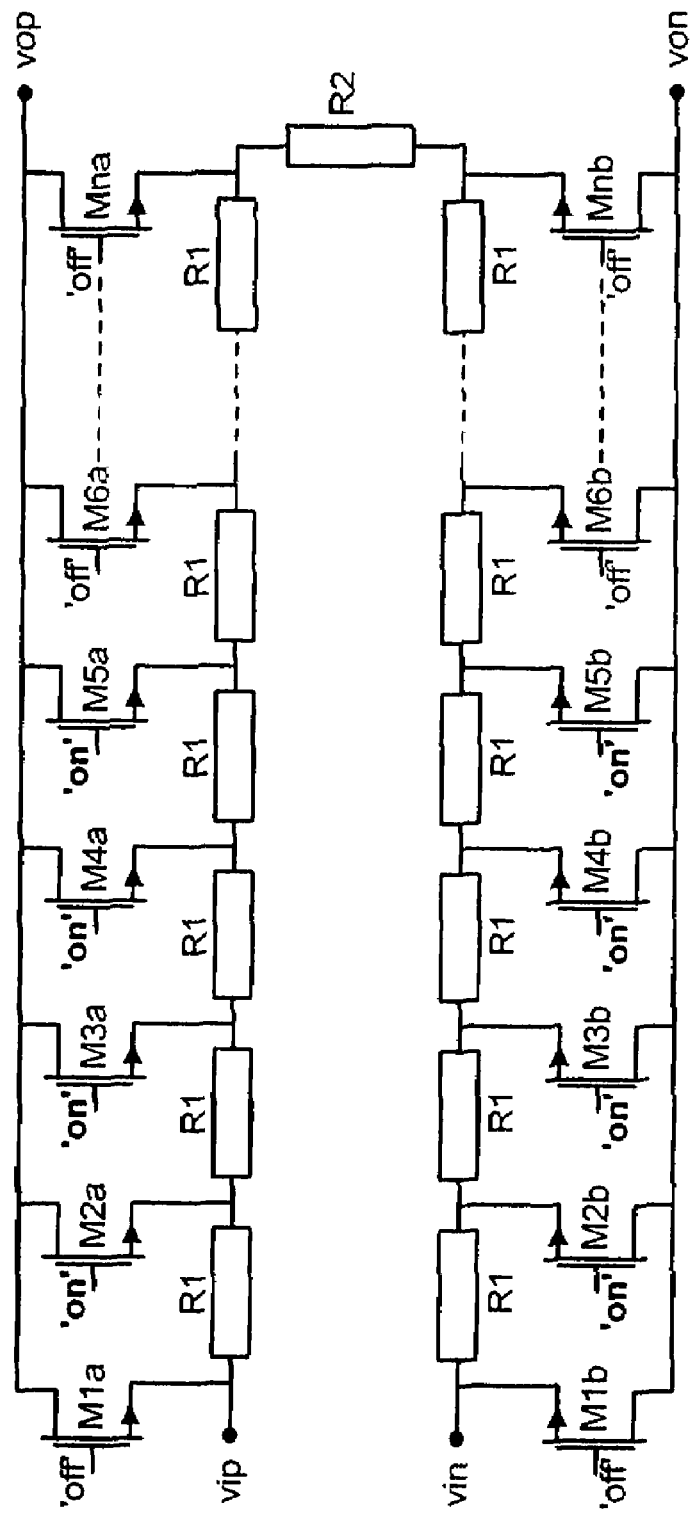
FIG. 2 shows an improved conventional PGA.
Figure 3A:
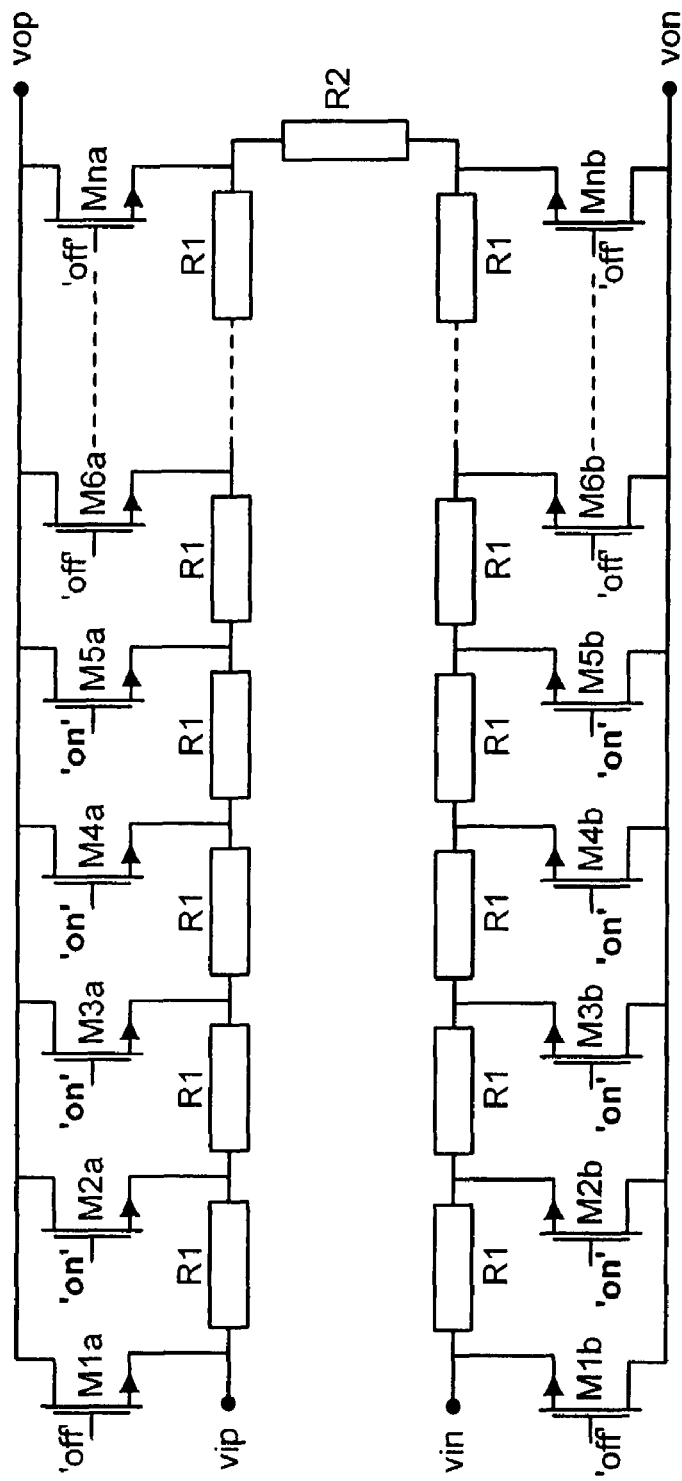
FIGS. 3A-3C show a PGA of a single interpolation of output embodiment of the present invention.
Figure 3B:
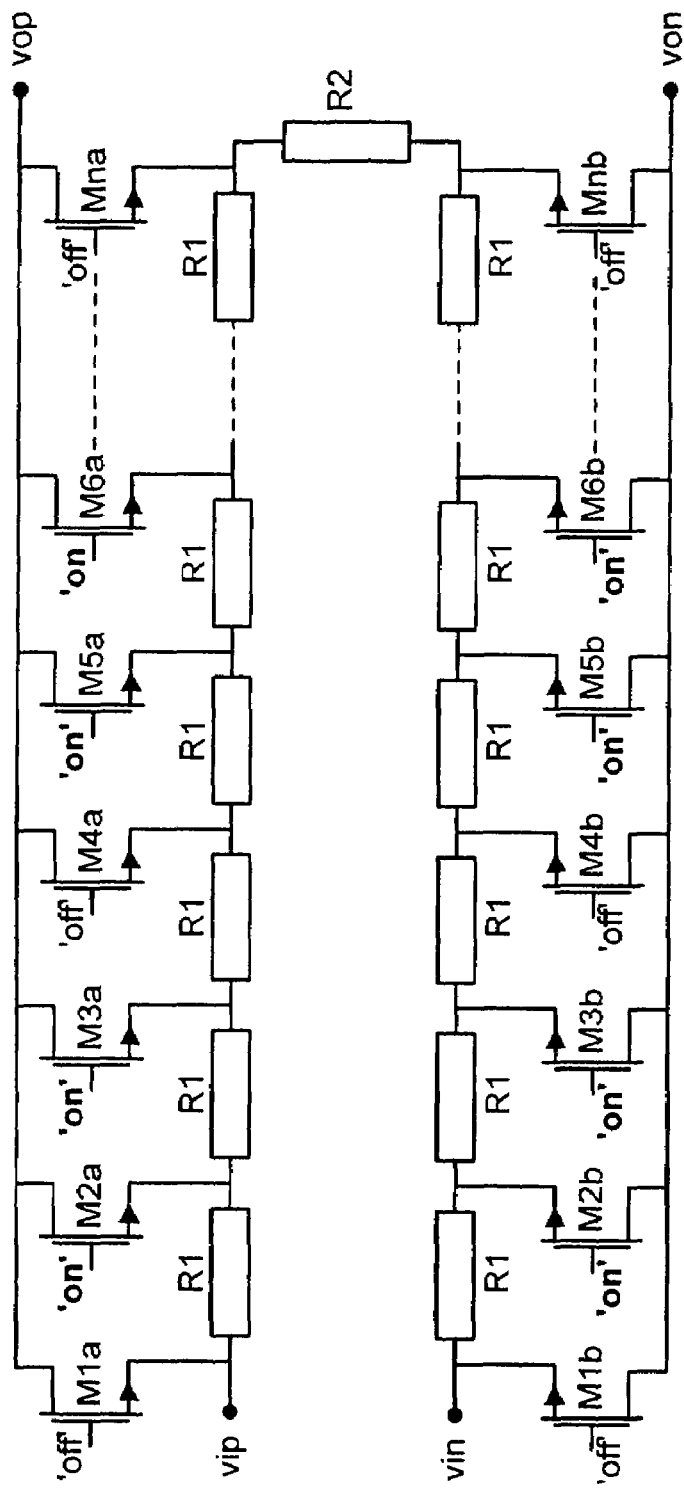
Figure 3C:
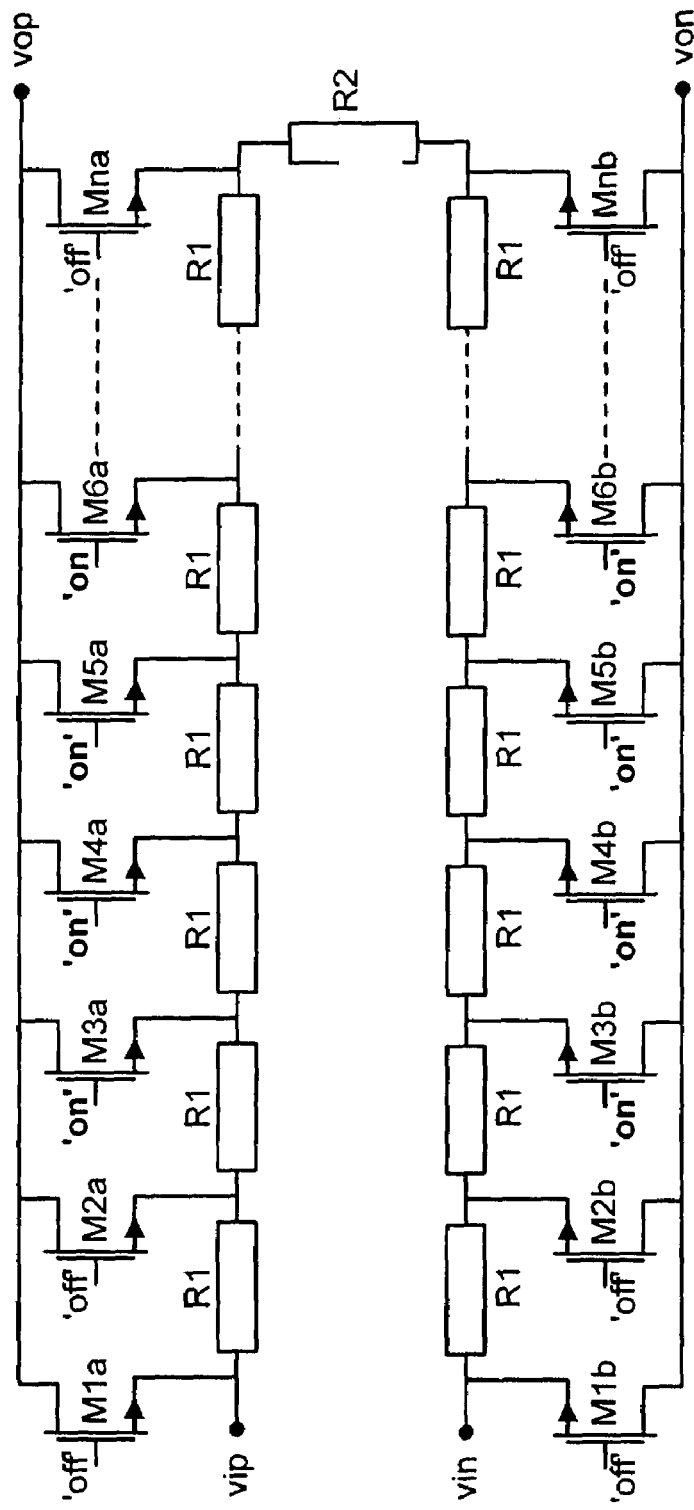

A further improvement with respect to the conventional PGA shown in FIG. 2 is described herein. The proposed PGA circuit is depicted in FIG. 3 and can be used in any AFE application. An example of a PGA circuit is described in commonly assigned U.S. patent application Ser. No. 09/712, 422, filed Nov. 13, 2002, entitled, GIGABIT ETHERNET TRANSCEIVER WITH ANALOG FRONT END, which is incorporated by reference herein. The PGA uses the switches to interpolate between different taps of the resistive divider. This is accomplished by turning switches 'on' that are not consecutive. In other words, consecutive switches are turned on, followed by one or more switches off, followed by more consecutive switches on. FIGS. 3A-3C show three settings of the PGA. In two PGA states shown in FIGS. 3A and 3C, switches $M_2$ through $M_5$, and $M_3$ through $M_6$, are turned 'on' respectively. In the PGA setting shown in FIG. 3B, switches $M_2$, $M_3$, $M_5$ and $M_6$ are turned 'on'. Thus, the setting shown in FIG. 3B interpolates between the two settings shown in FIGS. 3A and 3C. (In these figures, "termination switches" are $M_{1a}$, $M_{1b}$ and $M_{na}$, $M_{nb}$).

Further interpolation can be achieved by turning on switches $M_2$, $M_3$, $M_4$ and $M_6$, interpolating between the settings shown in FIGS. 3A and 3B. Also, switches $M_2$, $M_4$, $M_5$ and $M_6$, can interpolate between the settings shown in FIGS. 3B and 3C.

The PGA also incorporates a digital decoder (not shown in the figures) that determines which switches are to be turned on for a certain PGA setting.

This interpolation works on condition that the on-resistance $r_{on}$ of the individual switches $M_1$, $M_2$, $M_3$, ... $M_n$ is greater than the unit resistance $R_1$ of the PGA. Usually, this is not a limitation in practice.

The proposed PGA has several advantages. First, the PGA uses fewer switches. This reduces both the chip area and the total parasitic capacitance introduced by the switches. Lower parasitic capacitance results in a higher PGA bandwidth. Secondly, the PGA requires less taps, and therefore, less resistors, further decreasing the chip area of the PGA.

For example, in the PGA circuit shown in FIGS. 3A-3C, 4× less switches and resistors $R_1$ are required, while the resistance of $R_1$ can be increased by a factor of 4.

Note that the possibilities for doing interpolation increase with the number of switches being turned 'on' simultaneously. So, in general, the possible improvement of bandwidth and area is larger when, e.g., 16 switches are always 'on' versus 4 switches always 'on'.

Other alternatives include settings where, e.g., $M_1$, $M_4$, $M_5$, and $M_6$ are turned 'on', or, e.g., $M_2$, $M_4$, $M_6$ and $M_7$ are turned 'on'. That is, more than one switch is turned 'off' between the left-most and right-most switches turned 'on'. The switches that are turned 'off' in-between the 'on'-switches also do not have to be consecutive.

With further reference to FIGS. 3A-3C, it will be appreciated that although only four switches are shown turned on at any given time, a different number of switches may be turned on, e.g., M=8 switches or M=16 or some other number. The number of the switches needed by the PGA therefore decreases. If N is the total number of steps in a PGA, and M is the number of switches turned on at any given time, then the overall number of switches needed by the PGA is approximately 2×N/M, plus approximately 2×M switches to account for the border cases. For M<<N, the overall reduction in the number of switches is roughly N. It follows therefore that, at least theoretically the optimum number of switches being turned on is M=$\sqrt{N}$. In practice, this is not quite accurate, due to the non-linearity of the on-resistance $r_{on}$, of the individual switches $M_1$, $M_2$, $M_3$, ... $M_n$. As a result of this non-linearity, the PGA output signal will always be slightly distorted. This harmonic distortion increases with the difference in signal amplitude among the source terminals of the M switches being turned on. The amount of distortion that is allowed is application-dependent.

Note also that with the approach just described, the step size may be different, in other words, the options for interpolation may increase. As an example, for a 512 step PGA (N=512), a practical value for M is about 16-18.

Additionally, in FIGS. 3A and 3C, four switches are on, and one is off, an alternative arrangement may be used where two switches in the middle are off, surrounded by two switches on one side and two switches on the other side (or some other number depending on M). Similarly, some other number of switches that are turned off while being surrounded by other "on" switches may be used, e.g., 3 or 4 or some other number. Furthermore, it is possible to combine cases where only one switch is off, e.g., FIG. 3B, with cases where one switch is on, and one switch is off, as described above. This can reduce the number of switches and resistors needed by the PGA somewhat, although some of the values are duplicative between the various approaches.

Figure 1:
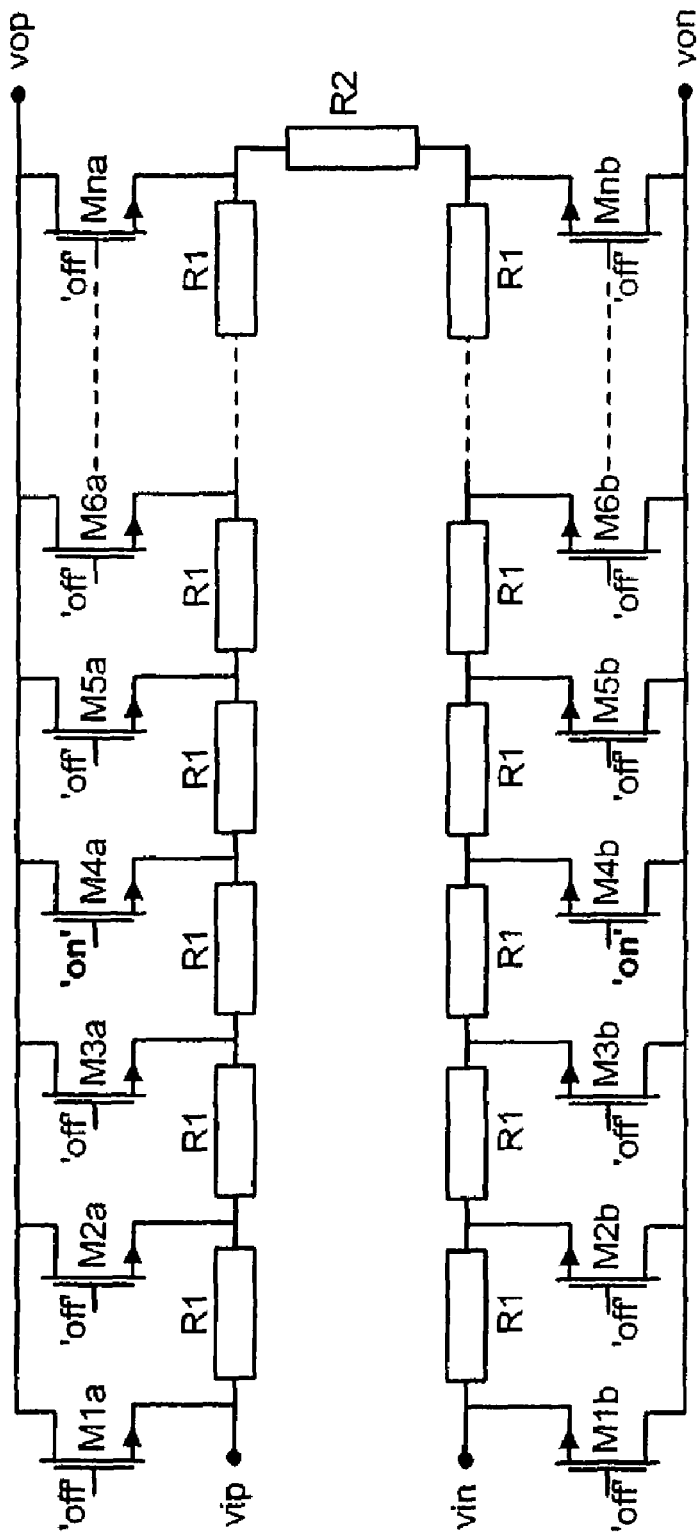
FIG. 1 shows a conventional PGA.

The area reduction using this approach scales approximately with M. Thus, for the 4× case (M=4) shown in FIGS. 3A-3C, the overall area used by the PGA is approximately ¼ (perhaps slightly more than one quarter) of the area utilized in the Conventional PGA described with reference to FIGS. 1 and 2.

Thus, with reference to FIGS. 3A, 3B and 3C, if the amplitude of the output signal of FIG. 3A is 4.1 volts, and the output of FIG. 3C is 4.0 volts, the amplitude of the output signal of FIG. 3B would be 4.05 volts.

The value of $R_2$ can be the same or approximately the same as $R_1$, for a linear PGA. For a logarithmic, or linear-in-dB, $R_2$ is usually approximately the value of the characteristic impedance.

It will also be appreciated that the greater the complexity of turning the switches on and off (in other words the more variations there are in how the various combinations of consecutive transistors are turned on and off together, the more complex the encoder/controller for PGA operation needs to be).

The improvement in bandwidth due to the parasitic capacitance reduction also scales roughly with M. Thus, for a nominally 50 MHz device, and M=4, the bandwidth of the device increases to approximately 200 MHz.

The invention can also be applied to logarithmic PGAs, also known as 'linear-in-dB' PGAs. In a logarithmic PGA, there is not only a termination resistor R2 at the end of the left and right resistive dividers, but there are also several additional resistors connected between corresponding taps of the left and right dividers. The value of the additional resistors is typically a little higher than the value of R2. Another way to describe the logarithmic PGA is as a cascaded version of the PGA is described in the application.

The invention can also be applied to a D/A converter as follows: a DC reference voltage is applied to the PGA. This DC voltage is then divided by the resistor ladder. The digital input word of the D/A converter, through a digital decoder, determines which switches will be turned on/off. The invention, using interpolation, can be used to reduce the number of switches and number of taps on the resistive divider needed for a particular D/A converter.

The embodiment described above may be referred to as the 'Single Interpolation Programmable Gain Attenuator' (SIPGA). The use of a single interpolation for the output of a PGA, as described above, greatly reduces the total area required by a PGA, especially when it has a high number of settings. This area reduction not only yields a much better cost efficiency, but also decreases the size of important parasitic components, thereby improving the maximally attainable bandwidth of the circuit.

In SIPGAs, the gain in size and bandwidth with respect to a conventional PGA largely depends on the number of switches taking part in the interpolation. For this reason the number of switches taking part in the interpolation should be as high as possible. However, when the number of switches taking part in the interpolation becomes a significant fraction of the total number of switches, the number of switches that has to be added to the front and to the back of the SIPGA, is no longer negligible. The increased number of switches and the increased length of the PGA will increase the required area, thereby lowering the bandwidth of the SIPGA and lower the maximum gain setting of the SIPGA. This problem is solved in a PGA with a modified scheme that can be referred to as a Multiple Interpolation PGA, or MIPGA, which is described below.

In order to substantially alleviate the problems relative to using a large number of switches in the SIPGA is to use more rows of interpolation switches connected in parallel to the main resistor circuit providing the required attenuation.

Figure 4:
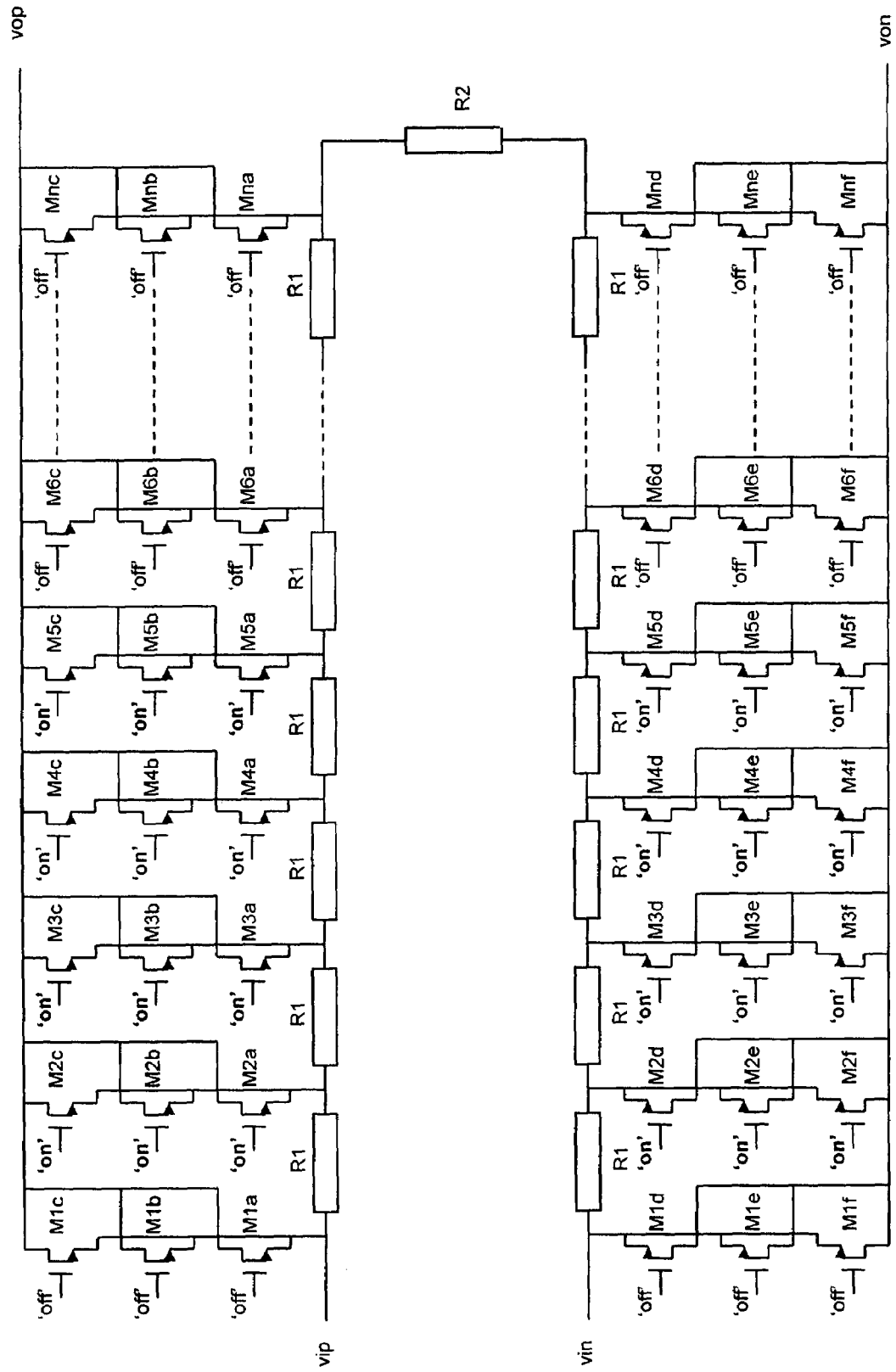
FIGS. 4-7 show a PGA of a multiple interpolation of output embodiment of the present invention.

FIG. 4 shows an example of a MIPGA. In FIG. 4, the single row of switches shown in FIG. 2 is replaced by multiple rows of interpolation switches, designated $M_{1a}$-$M_{1f}$, $M_{2a}$-$M_{2f}$, etc.

When in a SIPGA, N switches is used to create the interpolated output signal, N switches are also used in the MIPGA embodiment shown in FIG. 4, with the difference that in the MIPGA embodiment, the switches are arranged in multiple rows, connecting to the same main resistor circuit. Therefore, when L rows of switches are used in a MIPGA, the total width of the section of switches is reduced by a factor of L, effectively reducing the problems described above.

Each row of switches in the MIPGA can be controlled in the same manner as the switches in the SIPGA. Though not required, the length of the section of switches that are 'on' in each row is preferably the same. Interpolation between values can be done by introducing 'off' switches in each section of 'on' switches in each row. This can be done on a 'per row' basis, shifting the 'off' switch or switches through each section of 'on' switches and than starting interpolation in the next row, but also interpolation schemes can be designed that do interpolation between values in more rows at the same time.

Figure 5:
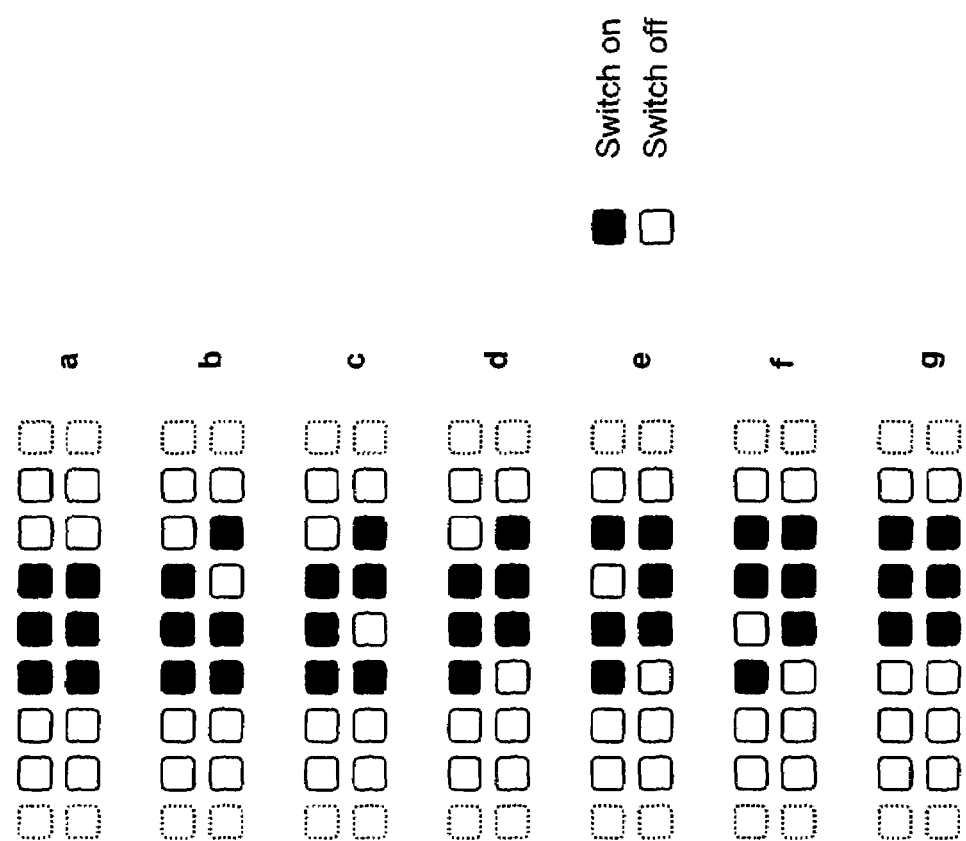

In FIG. 5, an example of part of a possible interpolation scheme is shown that can be used to interpolate between two consecutive attenuation steps of the main resistor attenuator. This figure shows one possible interpolation scheme using two rows of three 'on' switches that is interpolated "between". (Note that, using this terminology, FIG. 4 would be described as using "three rows", i.e., $M_{1a}$-$M_{1c}$, etc., not two.) In this example, each switch that is 'on' or 'off' can also be a plurality of switches.

For accuracy reasons, it is preferable to design the interpolation circuit such that the switches that are turned 'on' as close as possible to the center of interpolation.

The area efficiency of the MIPGA design depends to some extent on the efficiency of the design of the digital decoder that is used to control the switches. As can be recognized from FIG. 5, the decoding scheme can be seen as a 'fine' pattern that is repeated many times along the PGA on a 'coarse' grid. In part (g) of FIG. 5, the same fine pattern can be recognized as part (a) of FIG. 5. When a digital algorithm is used such that it recognizes a repetition over one or more steps, the implementation of the digital decoder can be very efficient.

Figure 6:
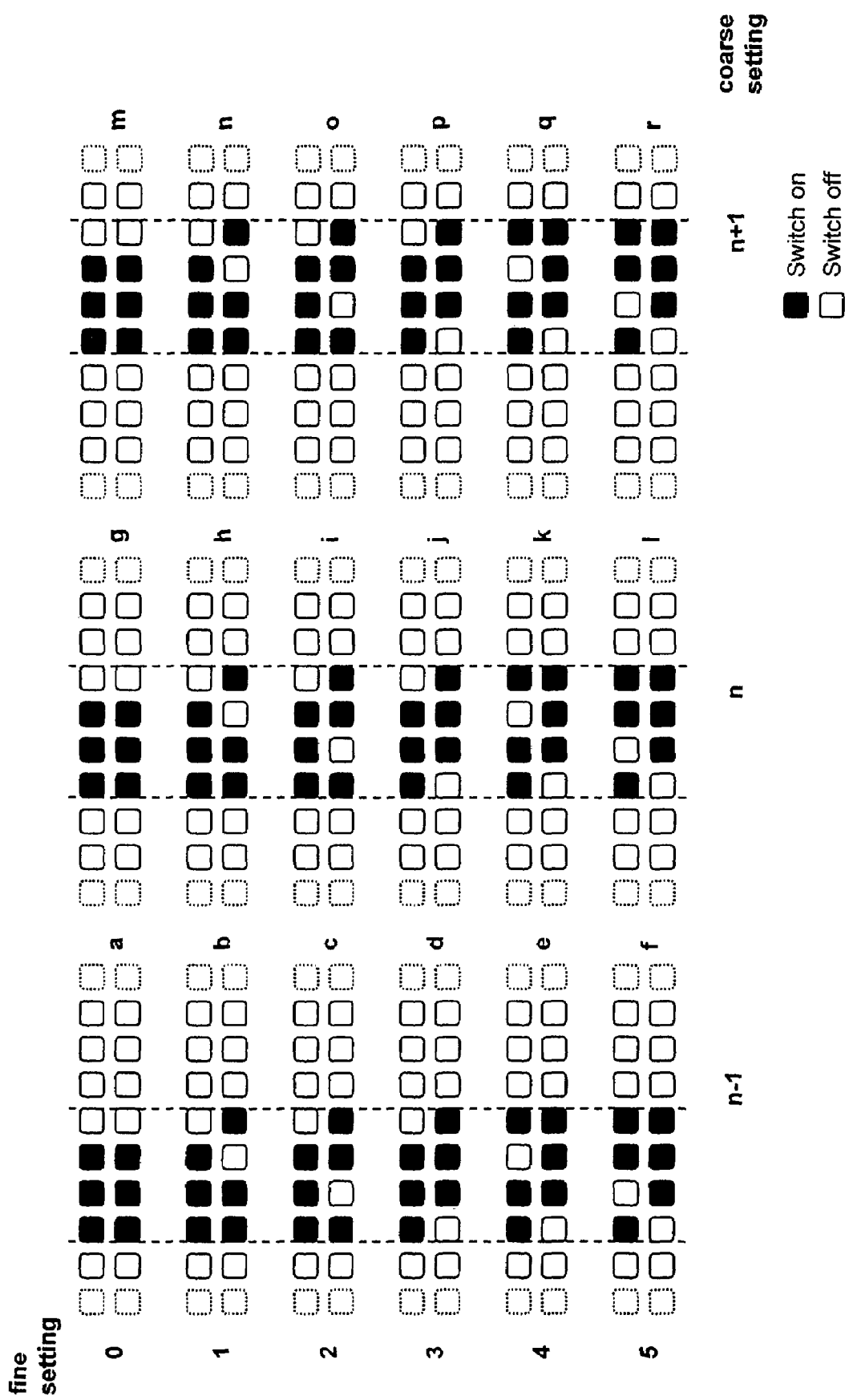

The separation of coarse and fine is further illustrated in FIG. 6, (a)-(f), (g)-(l) and (m)-(r), the same fine combinations are depicted as in FIG. 5. It will be recognized that settings on the same row of this figure (a-g-m, b-h-n, etc.) are repetitions of the same fine pattern, shifted by one step in the coarse grid. Therefore, in this algorithm, a repetition of a pattern of six 'fine' steps can be recognized. The position of the fine matrix is determined by the coarse setting. The clear split between coarse and fine makes an efficient implementation of the digital decoder possible.

In the example of FIG. 5, the fine pattern can be recognized as a 4×2 matrix. This 4×2 matrix has six different patterns, and thus six different fine settings. These six different fine patterns can now be repeated, by shifting the whole matrix along the PGA on a coarse grid (in this case, the coarse grid being units of 3×2 switches). Thus, an advantageous additional feature of the decoder is preventing large signal swings at the input of the attenuator from reaching the output of the PGA, by preventing glitches in the decoding logic that could be able to turn on switches near the input of the PGA.

Figure 7:
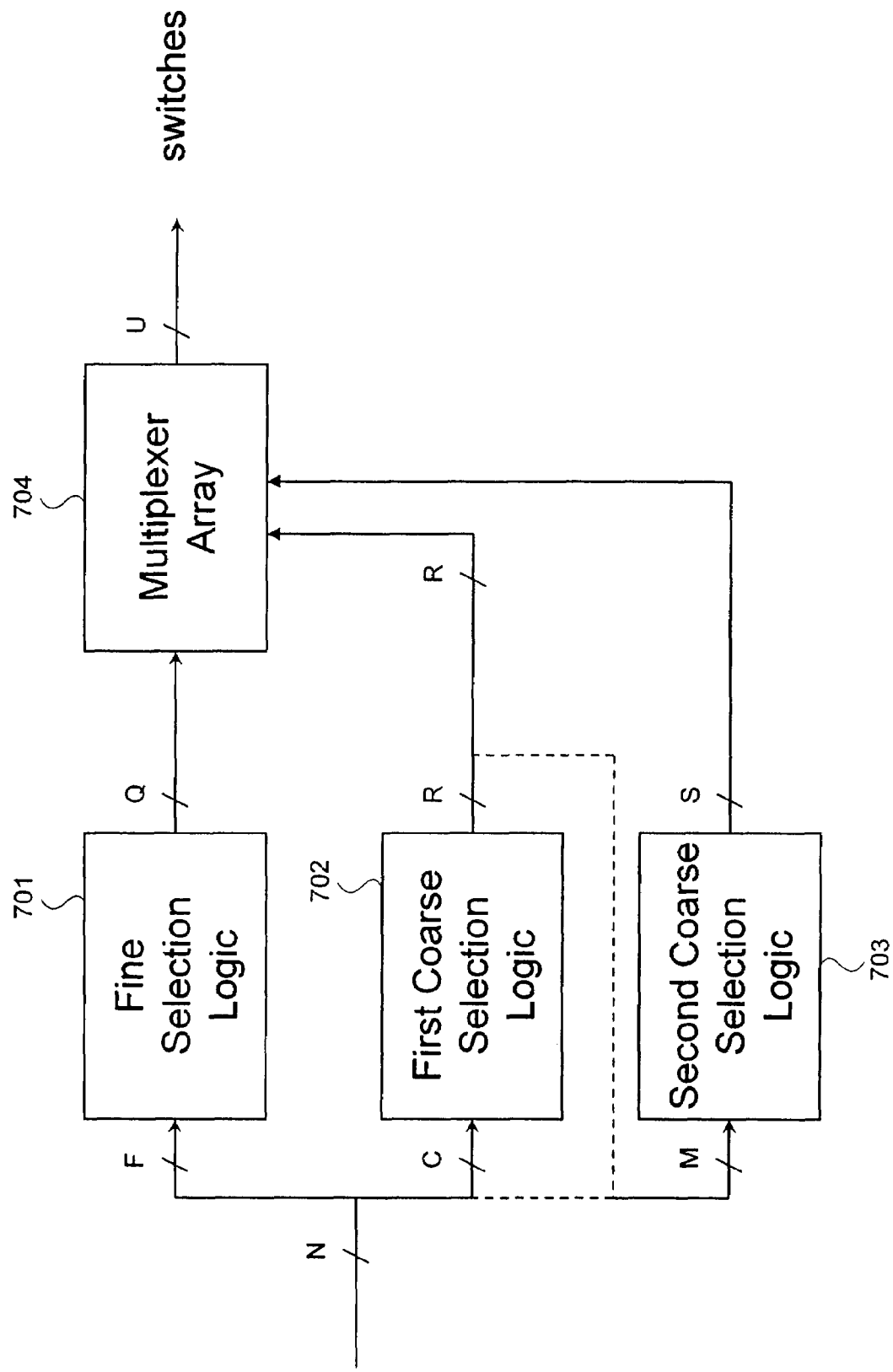

The digital decoder can be made very efficiently, when taking advantage of the pattern note above. In FIG. 7, a possible architecture for the implementation of the digital selection algorithm is depicted. The architecture is primarily intended to yield a small area, while preventing glitches in the decoding logic that can turn on switches near the input of the PGA.

Glitches in the decoding logic that pass large input signals to the output of the PGA can be prevented by applying strobing circuits between the output of the logic and the control inputs of the switches. This method conventionally requires a large number of circuits between the outputs of the control logic and the input of the control switches, thereby severely degrading the area efficiency of the design. Using the approach described herein, by splitting up the decoding logic for the switches that perform the coarse control and those that perform fine control the amount of circuits required for the strobing can be decreased significantly. The coarse control of the switches can disable all switches not taking part in the interpolation. When this happens, the design can be considered free of large signals at the output.

In FIG. 7, for a MIPGA having $2^N$ attenuation settings, an N bit digital word is split into a fine word of F bits and a coarse word of C bits. In fine selection logic 701, the F-bit fine word is translated into a fine selection matrix, similar to FIG. 6. It is obvious, that the fine encoding works most efficiently and elegantly when the total number of possible fine matrices is a power of 2. In that case every combination of F input bits can directly be translated into a fine matrix. When the number of 'off' switches that ripples through the 'on' switches is one, the number of useful variations of the fine matrix is equal to the number of switches that are 'on' in each step. From FIG. 6, it can be seen that six switches are 'on' in each step, and there are six useful variations of the fine matrix. A more efficient choice for the decoding logic is, for example, a 5=4 fine matrix in which $2^4$=16 switches are 'on' in each step. Further taking a 9-bit MIPGA having $2^9$=512 steps as an example, the numbers N, F, C and Q in FIG. 7 become: N=9, F=4, C=5, Q=20.

A first coarse selection block 702 takes in C input bits and sends the fine matrix via a multiplexer array 704 to the control inputs of the switches. In FIG. 7, U is the total number of switches on one side of the MIPGA, where it is assumed that control gates of switches on opposites sides of the MIPGA are switched 'on' and 'off' by the same signals, which would preferable in most cases.

A second coarse selection block 703 switches 'off' all control signals that are kept undetermined by the multiplexer array. This block can disable all switches not taking part in the interpolation and thus prevent large signals at the input of the PGA from reaching the output of the PGA.

CONCLUSION

While various embodiments of the present invention have been described above, it should be understood that they have been presented by way of example, and not limitation. It will be apparent to persons skilled in the relevant art that various changes in form and detail can be made therein without departing from the spirit and scope of the invention.

What is claimed is:

1. A programmable gain attenuator (PGA), comprising:
    a resistive ladder;
    a plurality of switches arranged in a matrix including a plurality of coarse switch submatrices connected to corresponding taps of the resistive ladder and to an output,
    wherein each coarse switch submatrix is arranged in a plurality of fine patterns,
    wherein the plurality of switches interpolate a desired voltage at the output by shifting each coarse switch submatrix among the plurality of switches and repeating the plurality of fine patterns over each coarse switch submatrix; and
    a termination resistor.

2. The PGA of claim 1, wherein the plurality of fine patterns are formed by turning on switches in the coarse switch submatrix.

3. The PGA of claim 1, wherein the fine switch submatrix is controlled using fine selection logic through a multiplexer.

4. The PGA of claim 1, wherein each coarse switch submatrix is controlled using coarse selection logic through a multiplexer.

5. The PGA of claim 1, wherein the matrix includes two or more rows and two or more columns.

6. The PGA of claim 5, wherein the switches in each column of the matrix are arranged in parallel with the other switches in the particular column.

7. The PGA of claim 6, wherein the switches in each particular column have their respective inputs directly coupled together, and their respective outputs directly coupled together.

8. A programmable gain attenuator (PGA), comprising:
    a resistive ladder; and
    a plurality of switches arranged in a plurality of coarse switch submatrices connected to corresponding taps of the resistive ladder,
    wherein each coarse switch submatrix is arranged in a plurality of fine patterns,
    wherein the plurality of switches interpolate between the corresponding taps of the resistive ladder by shifting each coarse switch submatrix among the plurality of switches and repeating the plurality of fine patterns over each coarse switch submatrix.

9. The PGA of claim 8, wherein the plurality of fine patterns are formed by turning on switches in the coarse switch submatrix.

10. The PGA of claim 8, wherein the fine switch submatrix is controlled using fine selection logic through a multiplexer.

11. The PGA of claim 8, wherein each coarse switch submatrix is controlled using coarse selection logic through a multiplexer.

12. The PGA of claim 8, wherein the matrix includes two or more rows and two or more columns.

13. The PGA of claim 12, wherein the switches in each column of the matrix are arranged in parallel with the other switches in the particular column.

14. The PGA of claim 13, wherein the switches in each particular column have their respective inputs directly coupled together, and their respective outputs directly coupled together.

* * * * *